United States Patent [19]
Daniel

[11] Patent Number: 5,929,684
[45] Date of Patent: Jul. 27, 1999

[54] FEEDBACK PULSE GENERATORS

[75] Inventor: Gabriel Daniel, Jamaica Estates, N.Y.

[73] Assignee: Siemens Aktiengesellschaft, Munich, Germany

[21] Appl. No.: 09/036,486

[22] Filed: Mar. 6, 1998

[51] Int. Cl.[6] ................................................. G06F 1/04
[52] U.S. Cl. ......................................... 327/299; 327/173
[58] Field of Search .................................. 327/227, 299, 327/291, 276, 34, 172, 173

[56] References Cited

U.S. PATENT DOCUMENTS

| | | | |
|---|---|---|---|
| 2,902,686 | 3/1959 | Auerbach et al. | 340/345 |
| 3,192,408 | 6/1965 | Cho | 307/88.5 |
| 3,768,026 | 10/1973 | Pezzutti | 328/207 |
| 4,843,255 | 6/1989 | Stuebing | 307/273 |
| 4,965,465 | 10/1990 | Denda | 327/261 |
| 4,994,687 | 2/1991 | Fujii | 327/227 |
| 5,059,818 | 10/1991 | Witt et al. | 307/269 |
| 5,298,799 | 3/1994 | Cochran | 327/227 |
| 5,422,585 | 6/1995 | Fan Chiangi et al. | 327/170 |

FOREIGN PATENT DOCUMENTS 62-261215 11/1987 Japan .
5-218824 8/1993 Japan .

Primary Examiner—Kenneth B. Wells
Assistant Examiner—Maria Hasanzadah
Attorney, Agent, or Firm—Stanton C. Braden

[57] ABSTRACT

Feedback pulse generators each have an input and an output, a first digital gating circuit, and a second digital gating circuit. The first digital gating circuit is coupled between the input and the output of the pulse generator, and is responsive to an input signal from an external source changing from a first logic state to a second logic state that is received at a first input thereof for initiating a pulse at the output of the pulse generator. The second digital gating circuit is coupled in a feedback path between the output of the pulse generator and a second input to the first digital gating circuit, the second digital gating circuit is responsive to the initiation of the pulse at the output of the pulse generator while the input signal from the external source is in the second logic state for providing a control signal with a predetermined delay to the first digital gating circuit for terminating the pulse at the output of the pulse generator so that the pulse is available for a predetermined period of time essentially independent of any load on the output of the pulse generator.

14 Claims, 3 Drawing Sheets

/ 1

FEEDBACK PULSE GENERATORS

FIELD OF THE INVENTION

The present invention relates to pulse generators, and more particularly, to pulse generators which are capable of generating accurate pulses while accommodating various load conditions.

BACKGROUND OF THE INVENTION

A control pulse is frequently required to trigger an event in some high performance circuits. Referring now to FIG. 1, there is shown a typical prior art pulse generator 10 (shown within a dashed-line rectangle) comprising a NAND gate 12, an inverter 14, a delay network 16, and a load 18. FIG. 2 shows voltage waveforms versus time associated with the pulse generator 10. The pulse generator 10 is similar to a prior art arrangement of a one shot circuit shown in FIG. 1 of U.S. Pat. No. 5,498,989 (Diba), issued on Mar. 12, 1996. It is to be understood that certain similar prior art arrangements have substituted a NOR gate for the NAND gate 42 with other minor modifications to provide a similar operation as the pulse generator 10. Therefore, the NAND gate 12 is hereinafter referred to as a NOR/NAND gate 12.

In the pulse generator 10, an output pulse is generated from an input signal by splitting the input signal into two parallel paths, the first being a direct path to a first input of the NOR/NAND gate 12, and the second being through a delay circuit 16 to a second input of the NOR/NAND gate 12. The output from the NOR/NAND gate 12 is transmitted through the inverter 14 to provide the output signal for the pulse generator 10. Referring now to FIG. 2, there are shown the waveforms 22 (the input signal), 24 (the delayed input signal (X) at the second input of the NOR/NAND gate 12), and 26 (the output signal appearing at the output of inverter 14) versus time. As is shown in FIG. 2, an output pulse from the pulse generator 10 is initiated when the input signal 22 reaches a binary logic "1", and is begun to be terminated when the delayed input signal X reaches a Binary logic "0". In this approach, only the input signal 22 is used to create an output pulse. The one disadvantage of this arrangement is that it neglects the load 18 at the output of the pulse generator 10 which could dramatically affect the width and amplitude of the output pulse.

U.S. Pat. No. 5,059,818 (Witt et al.), issued on Oct. 22, 1991, discloses a self-regulating clock generator for providing an output clock signal. The output clock signal has first and second phases of sufficient length to accommodate microprocessor speed paths, and is provided in response to an input clock signal having a frequency and a duty cycle within a wide range of frequencies and duty cycles. The clock generator includes a latch comprising an output, and Set and Reset inputs coupled to separate NAND gates which each have first and second inputs coupled to a clock source and a delay feedback path from the output of the latch, respectively. The latch is arranged to be set and reset by the input clock signal, and to provide an output clock signal. A delay circuit in the feedback path from the latch output also enables the setting and resetting of the latch to establish the phase lengths of the output clock signal. One limitation of this arrangement is that the input clock signal has to go to a low state before the output signal has propagated through the delay circuit. This requires that the output pulse must be longer than the input clock pulse.

It is desirable to provide a precise pulse generator which is self resettable and uses predetermined internal signals with a feedback path for accommodating various load conditions.

SUMMARY OF THE INVENTION

The present invention is directed to a pulse generator comprising an input for receiving an input signal from an external source, an output for providing an output signal to drive an external device, a first digital gating circuit, and a second digital gating circuit. The first digital gating circuit is coupled between the input and the output of the pulse generator, and is responsive to the input signal from the external source changing from a first logic state to a second logic state that is received at a first input thereof for initiating a pulse at the output of the pulse generator. The second digital gating circuit is coupled in a feedback path between the output of the pulse generator and a second input to the first digital gating means. The second digital gating means is responsive to the initiation of the pulse at the output of the pulse generator while the input signal from the external source is in the second logic state for providing a control signal with a predetermined delay to the first digital gating means. This delayed control signal is used by the first digital gating means for terminating the pulse at the output of the pulse generator so that the pulse is only available for a predetermined period of time essentially independent of any load on the output of the pulse generator.

Viewed from another aspect, the present invention is directed to a pulse generator comprising an input for receiving an input signal from an external source, an output for providing an output signal to drive an external device, a first digital gating circuit, and a second digital gating circuit. The first digital gating circuit is coupled between the input and the output of the pulse generator, and is responsive to the input signal from the external source changing from a first logic state to a second logic state and received at a first input thereof for initiating a pulse at the output of the pulse generator. The second digital gating circuit is coupled in a feedback path between the output of the pulse generator and a second input to the first digital gating means, and comprises a NOR gate and a delay circuit. The NOR gate has a first input for receiving a delayed input signal from the external source, a second input coupled to the feedback path for receiving the output signal from the pulse generator, and an output. The delay circuit is coupled between the output of the NOR gate and a second input of the first digital gating means for providing a predetermined delay to an output signal from the NOR gate for causing the first digital gating circuit to terminate the pulse in the output signal of the pulse generator. More particularly, the second digital gating circuit is responsive to the initiation of the pulse at the output of the pulse generator while the input signal from the external source is in the second logic state for providing a control signal with a predetermined delay to the first digital gating means for terminating the pulse at the output of the pulse generator. In this manner, the output pulse is available for a predetermined period of time essentially independent of any load on the output of the pulse generator.

The invention will be better understood from the following more detailed description taken with the accompanying drawings and claims.

The drawings are not necessarily to scale.

DETAILED DESCRIPTION

It is to be understood that corresponding elements having the same function in the several figures of the drawings are provided with the same designation numbers.

Figure 1:
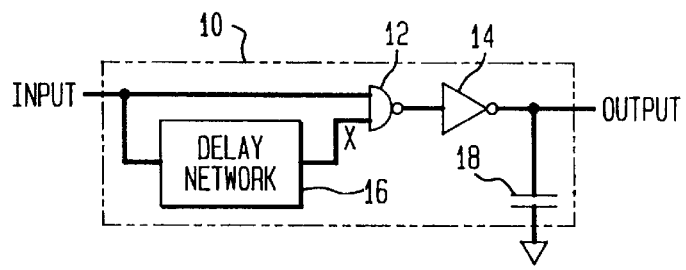
FIG. 1 is a block diagram of a prior art pulse generator.
Figure 2:
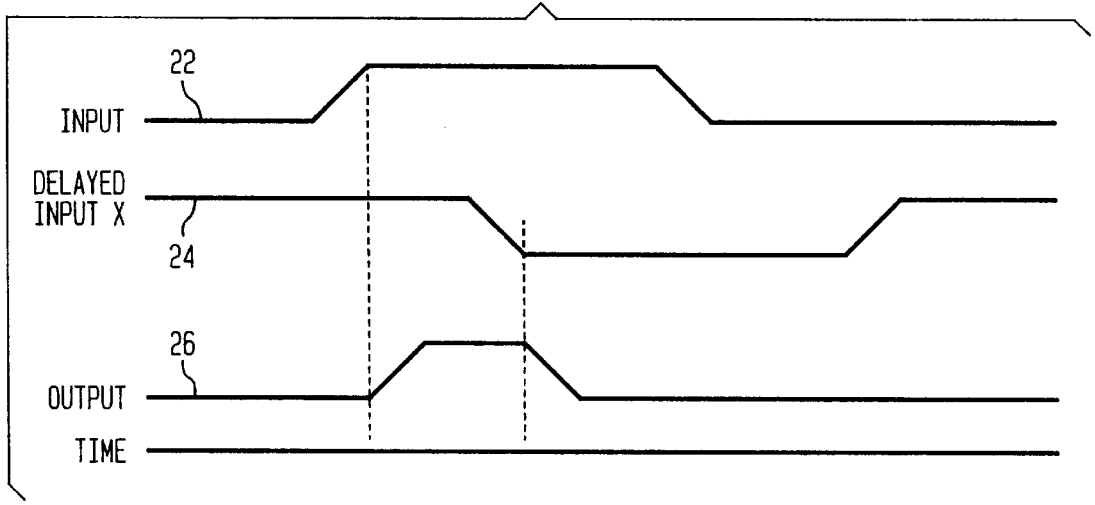
FIG. 2 illustrates typical voltage waveforms versus time of an input signal, a delayed input signal, and an output signal found in the prior art pulse generator of FIG. 1.
Figure 3:
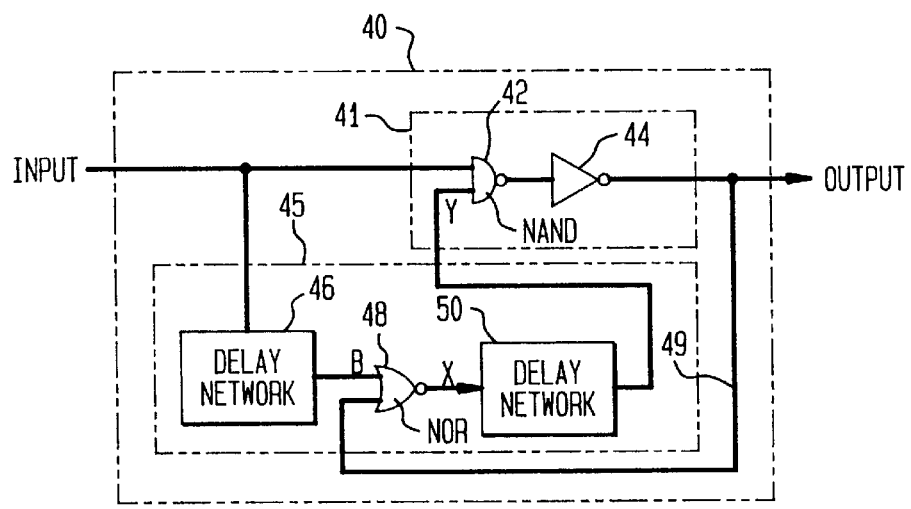
FIG. 3 is a block diagram of a feedback pulse generator in accordance with a first embodiment of the present invention.

Referring now to FIG. 3, there is shown a block diagram of a feedback pulse generator 40 (shown within a dashed-line rectangle) in accordance with a first embodiment of the present invention. The feedback pulse generator 40 comprises a first digital gating circuit 41 (shown within a dashed line rectangle) comprising a NAND gate 42 and an inverter 44, and a second digital gating circuit 45 (shown within a dashed line rectangle) comprising a first delay network 46, a NOR gate 48, and a second delay network 50. An input signal to the feedback pulse generator 40 is coupled to a first input of the NAND gate 42, and to an input of the first delay network 46. An output signal from the NAND gate 42 is coupled to an input of the inverter 44 which generates at its output an inverted input signal which serves as the output signal from the feedback pulse generator 40. An output signal (B) from the first delay network 46 (the delayed input signal) is coupled to a first input of the NOR gate 48. A second input of the NOR gate 48 receives the output signal of the feedback pulse generator 40 via a feedback path 49. The NOR gate 48 generates an output signal (X) which is transmitted through the second delay network 50 and coupled to a second input of the NAND gate 42. Each of the first and second delay networks 46 and 50 can comprise any suitable network known in the art for providing a predetermined delay as, for example, a plurality of N inverters (e.g., N=4) connected in series.

Figure 4:
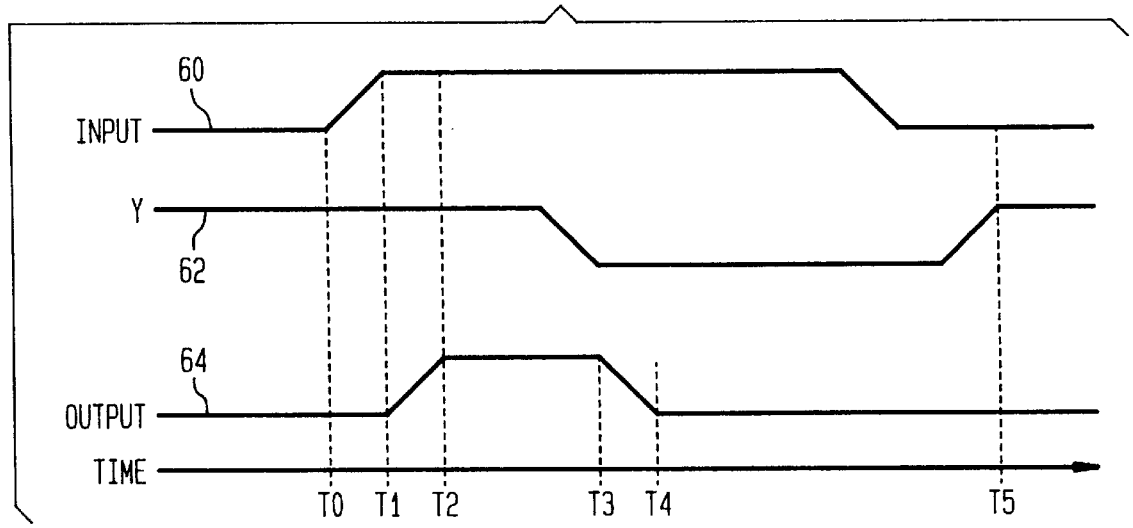
FIG. 4 illustrates typical voltage waveforms versus time of an input signal, a delayed and processed input signal, and an output signal for the pulse generator of FIG. 3.

Referring now to FIG. 4, there is shown typical voltage waveforms versus time for an input signal 60 to the feedback pulse generator 40, a delayed input signal (Y) 62 generated at the output of the second delay network 50, and an output signal 64 of the feedback pulse generator 40. It is to be understood that the periods of rise and fall of the pulses of the signals 60, 62, and 64, are not necessarily to scale and may be exaggerated to more clearly illustrate the timing of the various pulses. Initially, at T=T0 the input signal 60 is a binary logic "0" which is applied to the first input of the NAND gate 42. This causes the NAND gate 42 to output a binary logic "1" (regardless of the value applied to the second input thereof) that is inverted in the inverter 44 to a binary logic "0" and provided as the output signal 64 of feedback pulse generator 40. The binary logic "0" output signal 64 is fed back via the feedback path 49 to the second input of the NOR gate 48. At this time, the NOR gate 48 also receives the delayed binary logic "0" input signal 60 from the output of the first delay network 46 at the first input thereof. From these two input signals, the NOR gate 48 generates a binary logic "1" as an X output signal. This binary logic "1" output signal is transmitted through the second delay network 50 and applied as a Y input signal to the second input of the NAND gate 42. When the input signal 60 rises to a binary logic "1" at T=T1, the NAND gate 42 now has a binary logic "1" applied to both inputs which causes a binary logic "0" to be outputted therefrom and then to be inverted by inverter 44 to a binary logic "1" at T=T2 for transmission as the output signal 64 of the feedback pulse generator 40. Therefore, when the input signal 60 applied to the first input of the NAND gate 42 reaches a binary logic "1" while the Y signal 62 applied to the second input of the NAND gate 42 is a binary logic "1" at T=T1, a pulse in the output signal 64 is initiated and rises to a binary logic "1" at T=T2, as is shown in FIG. 4.

The binary logic "1" generated at the output of the feedback pulse generator 40 is fed back via feedback path 49 to the second input of the NOR gate 48 which still has a binary logic "0" applied to the first input thereof by the first delay network 46. At this instant, the NOR gate 48 generates a binary logic "0" which is delayed by the second delay network 50 for a predetermined time period and then applied to the second input of the NAND gate 42. Once the second input of the NAND gate 42 reaches a binary logic "0" while the input signal 60 is still a binary logic "1" at T=T3, the NAND gate 42 generates at its output a binary logic "1" which is then inverted by inverter 44 to a binary logic "0" at T=T4 and applied as the output signal 64 of the feedback pulse generator 40. At time T=T5, the pulse generator 40 has been restored to the logic state it was at T=T0 for selectively generating another output pulse. Therefore, the feedback pulse generator 40 uses the input signal 60 for initiating a pulse in the output signal 64, and the output signal 64 for resetting or terminating the pulse. By using the output signal 64 of the feedback pulse generator 40 for resetting an output pulse, any load of the feedback pulse generator 40 is accommodated.

Figure 5:
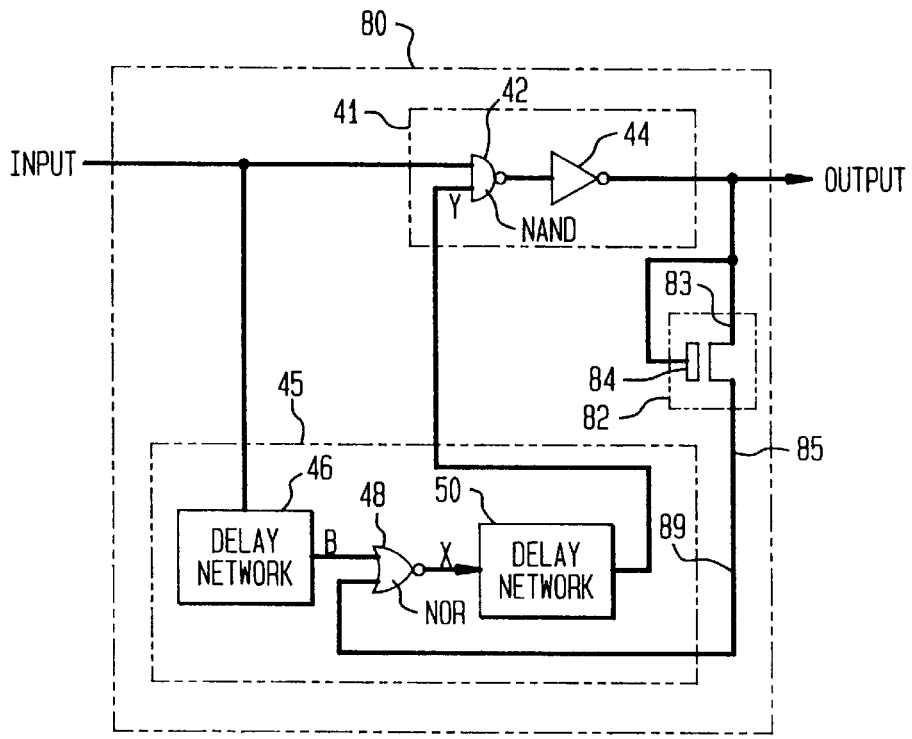
FIG. 5 is a block diagram of a feedback pulse generator in accordance with a second embodiment of the present invention.

Referring now to FIG. 5, there is shown a block diagram of a feedback pulse generator 80 (shown within a dashed line rectangle) in accordance with a second embodiment of the present invention. The feedback pulse generator 80 has essentially the same arrangement as the feedback pulse generator 40 of FIG. 3 except that a switching circuit 82 (shown within a dashed line rectangle) has been inserted into a feedback path 89. More particularly, the feedback pulse generator 80 comprises a first digital gating circuit 41 (shown within a dashed line rectangle) comprising a NAND gate 42 and an inverter 44, a second digital gating circuit 45 (shown within a dashed line rectangle) comprising a first delay network 46, a NOR gate 48, and a second delay network 50, and the switching circuit 82 inserted into a feedback path 89. The NAND gate 42, inverter 44, first delay network 46, NOR gate 48, and second delay network 50 are coupled to each other in the same manner described hereinbefore for the corresponding elements of the feedback pulse generator 40 of FIG. 3, and a will not be described again here. Regarding the feedback path 89, a second input of the NOR gate 48 receives the output signal of the feedback pulse generator 80 via the switching circuit 82. The NOR gate 48 generates an output signal (X) which is transmitted through the second delay network 50 and is coupled to a second input of the NAND gate 42. The switching circuit 82 in the feedback path 89 is preferably an n-channel field effect transistor wherein a gate electrode 84 and a drain electrode 83 thereof are both connected to the output of the feedback pulse generator 80, while a source electrode 85 of the transistor is coupled to the second input of the NOR gate 48. The transistor of switching circuit 82 is connected so as to function essentially as a diode. The feedback pulse generator 80 operates in the same manner as described hereinbefore for the feedback pulse generator 40 of FIG. 3, except that the transistor is only turned on (active)

when the output of the feedback pulse generator 80 is high (a binary logic "1"). The use of the transistor as the switching circuit 82 in the feedback path 89 functions to improve performance where the amplitude of the pulse signal is important. The waveforms produced in the feedback pulse generator 80 are essentially the same waveforms 60, 62, and 64 as are those shown in FIG. 4 since both feedback pulse generators 40 and 80 operate essentially in the same manner.

Figure 6:
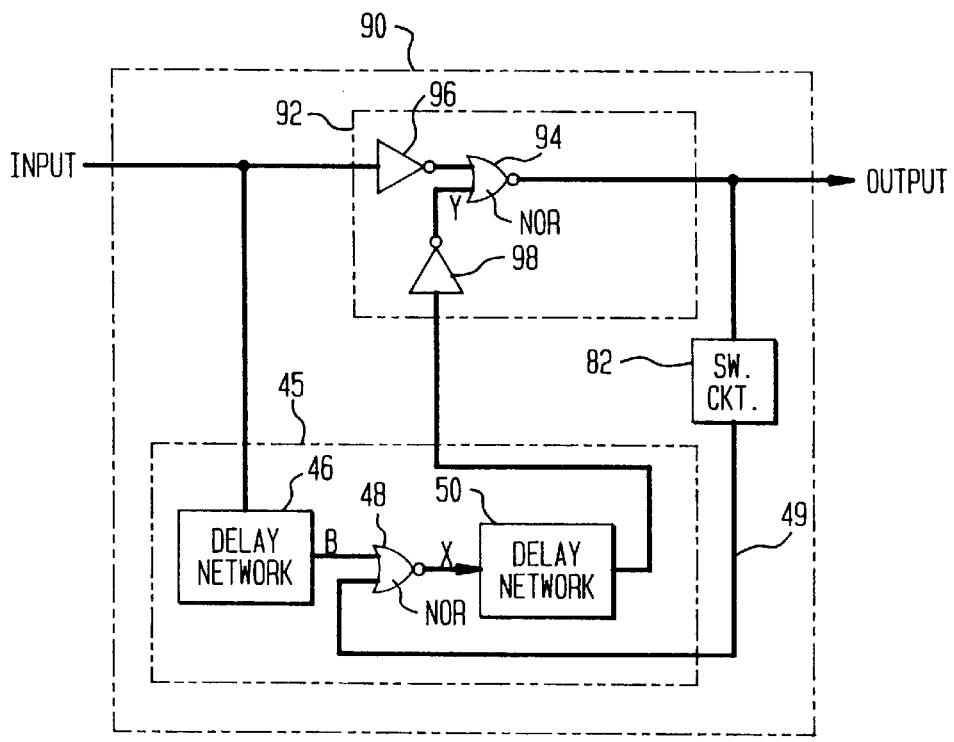
FIG. 6 is a block diagram of a feedback pulse generator in accordance with a third embodiment of the present invention.

Referring now to FIG. 6, there is shown a block diagram of a feedback pulse generator 90 (shown within a dashed line rectangle) in accordance with a third embodiment of the present invention. The feedback pulse generator 90 comprises an input, an output, a first digital gating circuit 92 (shown within a dashed line rectangle), and a second digital gating circuit 45 (shown within a dashed line rectangle) which corresponds to the second digital gating circuits 45 of FIGS. 3 and 5. The first digital gating circuit 92 is different than the first digital gating circuits 41 of FIGS. 3 and 5. More particularly, the first digital gating circuit 92 comprises a NOR gate 94 coupled directly to the output of the feedback pulse generator 90, a first inverter 96 coupled between the input of the pulse generator 90 and a first input of the NOR gate 94, and a second inverter 98 coupled between the output from the second digital gating circuit 45 and a second input to the NOR gate 94. With this arrangement, the operation of the feedback pulse generator 90 is the same as that described for the waveforms 60, 62, and 64 of FIG. 4 and the arrangement of FIG. 3. It is to be understood that an optional switching circuit 82 (SW. CKT.) (shown within a dashed line rectangle), corresponding to the switching circuit 82 shown in FIG. 5, can be inserted into a feedback path 49.

Initially, the input signal 60 of FIG. 4 is a binary logic "0" which is applied to the first input of the NOR gate 94 via the first inverter 96. The first inverter 96 causes a binary logic "1" to be applied to the first input of the NOR gate 94 which, in turn, outputs a binary logic "0" (regardless of the value applied to the second input thereof) that is provided as the output signal 64 of FIG. 4 of the feedback pulse generator 90. The binary logic "0" output signal 64 is fed back via the feedback path 49 to the second input of the NOR gate 48 which also receives the delayed binary logic "0" input signal 60 from the output of the first delay network 46. From these two input signals, the NOR gate 48 generates a binary logic "1" as the X output signal. This binary logic "1" is transmitted through the second delay network 50, inverted to a binary logic "0" in the second inverter 98, and applied as the Y input signal to the second input of the NOR gate 94. When the input signal 60 rises to a binary logic "1", the NOR gate 94 now has a binary logic "0" applied to both inputs to cause a binary logic "1" to be outputted therefrom for transmission as the output signal 64 of the feedback pulse generator 90. More particularly, when the input signal 60 reaches a binary logic "1" and is applied via the first inverter 96 as a binary logic "0" to the first input of the NOR gate 94 while the Y signal 62 applied to the second input of the NOR gate 94 is still a binary logic "0", a pulse in the output signal 64 is initiated and rises to a binary logic "1" as is shown in FIG. 4.

The binary logic "1" generated at the output of the feedback pulse generator 40 is fed back via feedback path 49 to the second input of the NOR gate 48 which still has a binary logic "0" applied to the first input thereof by the first delay network 46. At this instant, the NOR gate 48 generates a binary logic "0" which is delayed in the second delay network 50 for a predetermined time period, inverted in second inverter 98, and then applied to the second input of the NOR gate 94. Once the second input of the NOR gate 94 reaches a binary logic "1" while the input signal 60 is still a binary logic "0", the NOR gate 94 will output a binary logic "0" which is applied as the output signal 64 of the feedback pulse generator 90. Therefore, the feedback pulse generator 90 uses the input signal for initiating a pulse in the output signal 64, and the output signal 64 for resetting or terminating the pulse. By using the output signal of the feedback pulse generator 90 for resetting an output pulse, any load of the feedback pulse generator 90 is accommodated.

It is to be appreciated and understood that the specific embodiments of the invention described hereinabove are merely illustrative of the general principles of the invention. Various modifications may be made by those skilled in the art which are consistent with the principles set forth. For example, the first digital gating circuit 41 of the feedback pulse generator 80 can be replaced by the first digital gating circuit 92 of the feedback pulse generator 90 of FIG. 6.

What is claimed is:

1. A pulse generator comprising:

an input for receiving an input signal from an external source and an output for providing an output signal to drive an external device;

a first digital gating circuit coupled between the input and the output of the pulse generator, the first digital gating circuit being responsive to the input signal from the external source changing from a first logic state to a second logic state and received at a first input thereof for initiating a pulse at the output of the pulse generator; and a second digital gating circuit coupled in a feedback path between the output of the pulse generator and a second input to the first digital gating circuit, the second digital gating circuit being responsive to the initiation of the pulse at the output of the pulse generator while the input signal from the external source is in the second logic state for providing a control signal with a predetermined delay to the first digital gating circuit for terminating the pulse at the output of the pulse generator while the input signal from the external source is in the second logic state so that the pulse is available for a predetermined period of time and accommodates any load not providing a short circuit to ground on the output of the pulse generator.

2. The pulse generator of claim 1 wherein the first digital gating circuit comprises a NAND gate comprising a first input coupled to the input of the pulse generator, a second input coupled to the output of the second digital gating circuit, and an output; and an inverter coupled between the output of the NAND gate and the output of the pulse generator.

3. The pulse generator of claim 2 wherein the second digital gating circuit comprises a NOR gate having a first input for receiving a delayed input signal from the external source, a second input coupled to the feedback path for receiving the output signal from the pulse generator, and an output; and a delay circuit coupled between the output of the NOR gate and the second input of the NAND gate of the first digital gating circuit for providing a predetermined delay to an output signal from the NOR gate for causing the NAND gate to terminate the pulse in the output signal of the pulse generator.

4. The pulse generator of claim 3 wherein the second digital gating circuit further comprises a switching circuit coupled between the output of the pulse generator and the second input of the NOR gate for automatically providing a feedback signal to the second digital gating circuit only while a pulse in the output signal of the pulse generator is present.

5. The pulse generator of claim 4 wherein the switching circuit is a transistor comprising a gate electrode coupled to the output of the pulse generator, and source and drain electrodes coupled between the output of the pulse generator and the second input of the NOR gate.

6. The pulse generator of claim 1 further comprising a switching circuit coupled between the output of the pulse generator and the second input of the second digital gating circuit for automatically providing a feedback signal to the second digital gating circuit only while a pulse in the output signal of the pulse generator is present.

7. The pulse generator of claim 6 wherein the switching circuit is a transistor comprising a gate electrode coupled to the output of the pulse generator, and source and drain electrodes coupled between the output of the pulse generator and the second input of the second digital gating circuit.

8. The pulse generator of claim 1 wherein the first digital gating circuit comprises a first inverter, a second inverter, and a NOR gate comprising a first input coupled to the input of the pulse generator via the first inverter, a second input coupled to the output of the second digital gating circuit via the second inverter, and an output coupled directly to the output of the feedback pulse generator.

9. The pulse generator of claim 8 wherein the second digital gating circuit comprises a NOR gate having a first input for receiving a delayed input signal from the external source, a second input coupled to the feedback path for receiving the output signal from the pulse generator, and an output; and a delay circuit coupled between the output of the NOR gate and the second input of the NAND gate of the first digital gating means for providing a predetermined delay to an output signal from the NOR gate for causing the NAND gate to terminate the pulse in the output signal of the pulse generator.

10. The pulse generator of claim 9 wherein the second digital gating circuit further comprises a switching circuit coupled between the output of the pulse generator and the second input of the NOR gate for automatically providing a feedback signal to the second digital gating circuit only while a pulse in the output signal of the pulse generator is present.

11. The pulse generator of claim 10 wherein the switching circuit is a transistor comprising a gate electrode coupled to the output of the pulse generator, and source and drain electrodes coupled between the output of the pulse generator and the second input of the NOR gate.

12. A pulse generator comprising:

an input for receiving an input signal from an external source and an output for providing an output signal to drive an external device;

a first digital gating circuit coupled between the input and the output of the pulse generator, the first digital gating circuit being responsive to the input signal from the external source changing from a first logic state to a second logic state and received at a first input thereof for initiating a pulse at the output of the pulse generator; and a second digital gating circuit coupled in a feedback path between the output of the pulse generator and a second input to the first digital gating circuit, the second digital gating circuit comprising:

a NOR gate having a first input for receiving a delayed input signal from the external source, a second input coupled to the feedback path for receiving the output signal from the pulse generator, and an output; and a delay circuit coupled between the output of the NOR gate and a second input of the first digital gating circuit for providing a predetermined delay to an output signal from the NOR gate for causing the first digital gating circuit to terminate the pulse in the output signal of the pulse generator, the second digital gating circuit being responsive to the initiation of the pulse at the output of the pulse generator while the input signal from the external source is in the second logic state for providing a control signal with a predetermined delay to the first digital gating circuit for terminating the pulse at the output of the pulse generator while the input signal from the external source is in the second logic state so that the pulse is available for a predetermined period of time and accommodates any load not providing a short to ground on the output of the pulse generator.

13. The pulse generator of claim 12 wherein the first digital gating circuit comprises a NAND gate comprising a first input coupled to the input of the pulse generator, a second input coupled to the output of the second digital gating circuit, and an output; and an inverter coupled between the output of the NAND gate and the output of the pulse generator.

14. The pulse generator of claim 12 wherein the first digital gating circuit comprises a first inverter, a second inverter, and a NOR gate comprising a first input coupled to the input of the pulse generator via the first inverter, a second input coupled to the output of the second digital gating circuit via the second inverter, and an output coupled directly to the output of the feedback pulse generator.

* * * * *